United States Patent [19]

Glendinning

[11] Patent Number: 4,797,334

[45] Date of Patent: Jan. 10, 1989

[54] PATTERNING OPTICAL AND X-RAY MASKS FOR INTEGRATED CIRCUIT FABRICATION

[75] Inventor: William B. Glendinning, Red Bank, N.J.

[73] Assignee: The United States of America as represented by the Secretary of the Army, Washington, D.C.

[21] Appl. No.: 133,582

[22] Filed: Dec. 14, 1987

[51] Int. Cl.$^4$ ................................................. G03F 1/00
[52] U.S. Cl. ............................................ 430/5; 430/30;
430/296; 430/323; 430/329; 430/394; 430/742;
430/745; 250/472.3; 378/35
[58] Field of Search ............... 430/296, 942, 314, 315,
430/318, 967, 945, 5, 30, 323, 329, 394; 378/35;
250/492.2 B, 492.3

[56] References Cited

U.S. PATENT DOCUMENTS

| | | | |
|---|---|---|---|
| 4,264,711 | 4/1981 | Greeneich | 430/296 |
| 4,610,948 | 9/1986 | Glendinning | 430/296 |
| 4,717,644 | 1/1988 | Jones et al. | 430/296 |

OTHER PUBLICATIONS

Seliger et al, "Ion beams ... Wafer Lithography" Electronics, Mar. 1980, pp. 142–146.

Primary Examiner—José G. Dees
Attorney, Agent, or Firm—Sheldon Kanars; John K. Mullarney

[57] ABSTRACT

A layer of metal is deposited on a mask substrate and then covered with a layer of positive electron resist. A delineation of the peripheral boundaries of the desired mask geometry is carried out by means of a direct-write electron beam. Development and etching steps serve to remove the positive resist and the underlying metal in the beam-exposed peripheral boundaries. The mask is then raster scanned with a low intensity beam until a boundary is detected and then the beam intensity is increased significantly to a level sufficient to expose the positive resist. The scan and exposure continue until the mating peripheral boundary is detected and then the beam is rapidly decreased in intensity to its former low intensity level. The substrate is next developed to remove the positive resist subjected to the increased exposure-level beam intensity; and, the metal underlying this positive resist is then etched away. A final removal step serves to remove the remaining positive resist covering the substrate area outside of the geometry(s) circumscribed or delineated by said peripheral boundaries.

10 Claims, 1 Drawing Sheet

4,797,334

PATTERNING OPTICAL AND X-RAY MASKS FOR INTEGRATED CIRCUIT FABRICATION

The invention described herein may be manufactured, used, and licensed by or for the Government for governmental purposes without the payment to me of any royalties thereon.

TECHNICAL FIELD

The present invention relates generally to the fabrication of integrated circuits and, more particularly, to a novel technique or method of lithographic patterning of IC (integrated circuit) chip process mask plates (optical) and membranes (X-ray).

BACKGROUND OF THE INVENTION

Integrated circuit elements and the metallic interconnecting conductors thereon can be patterned on a wafer entirely by means of direct writing electron beam lithography (EBL). However, this fabrication technique requires excessive beam writing time of complex and expensive EBL machines and the complex circuit and conductor patterns so lithographed with many different spacings and widths of lithographed features requires complex correction of the computer-stored pattern to correct for proximity effects. Proximity effects are the widening of the lithographed features caused by forward and backscattering of the electron beam as it penetrates the electron resist material which covers the wafer. The magnitude of the proximity effect and hence the correction factor required is a function, among other things, of the widths of the features being lithographed.

The use of photolithography to imprint patterns on a chip or wafer by means of a patterned mask has been extensively used in the past for the fabrication of VHSIC/VLSI circuits. In fact, for historic and practical reasons, such as noted above, the use of patterned masks for IC fabrication is far-and-away the most common technique used today in IC fabrication.

U.S. Pat. No. 4,610,948, issued Sept. 9, 1986 to the present inventor, disclosed a hybrid technique which overcame some of the noted disadvantages associated with the direct writing EBL technique, as well as those theretofore encountered using patterned masks. The method of the patent achieves high accuracy, high density lithography of complex integrated circuits (VHSIC/VLSI) in a relatively economical and simple manner. Unfortunately, this hybrid technique, which relies on a combination of direct writing e-beam lithography (EBL) with the use of patterned masks, has "throughput" limitations. While this technique or process is more efficient (i.e., faster) than the direct writing EBL approach, its throughput is less than the straightforward use of patterned masks for IC fabrication.

Applicant's copending patent application entitled "Patterning Optical and X-Ray Masks for Integrated Circuit Fabrication," Ser. No. 125,860, , filed Nov. 27, 1987 discloses a technique or process for making high precision, high quality, defect free patterned masks. The method or process of the copending application comprises five basic steps or operations in the fabrication of integrated circuit mask substrates (i.e., optical plates and X-ray membranes). It should be readily apparent, however, that if the number of these steps or operations could be reduced the mask fabrication would be more efficient, i.e., the throughput in patterned mask fabrication would be increased.

SUMMARY OF THE INVENTION

It is a primary object of the present invention to increase the throughput in IC chip fabrication, while improving mask quality in the fabrication of optical mask plates and X-ray membranes.

A related object of the invention is to also increase the throughput in the fabrication of IC chip process mask plates (optical) and membranes (X-ray).

The above and other objects are attained in accordance with the present invention wherein a suitable layer of metal (e.g., chromium) is deposited on an optical mask plate (glass) or membrane (X-ray) and then covered with a layer of positive electron resist such as PMMA (polymethylmethacrylate). A delineation of the peripheral boundaries of the desired mask geometry is carried out by means of a direct-write spot electron beam (e-beam). After development and etching, in accordance with known techniques, the electron resist and the underlying metal in the peripheral boundaries exposed by the e-beam are removed. The mask plate is then raster scanned with a low intensity beam until a peripheral boundary is detected by a backscatter detector, for example. The beam intensity is then increased significantly to a level sufficient to expose positive electron resist. The scan and exposure continue until the "mating" peripheral boundary is detected and then the beam is rapidly decreased in intensity to its former low detection level. This operation is repeated as successive geometric boundaries are encountered in a scan sweep. The positive resist subjected to the high, exposure level, beam intensity is removed by a known development technique and the metal lying under the exposed positive resist is then etched away. Finally, the positive electron resist (PMMA) still covering the background areas (i.e., those areas lying outside of the patterns or parts circumscribed or encompassed by the peripheral boundaries) are removed by an oxygen plasma dry etch, for example, leaving a completed high precision, high quality, defect free patterned mask.

BRIEF DESCRIPTION OF THE DRAWINGS

The invention will be more fully appreciated from the following detailed description when the same is considered in connection with the accompanying drawings in which.

DETAILED DESCRIPTION

Before beginning the novel method of the invention, the mask substrate is covered with a thin layer of suitable metal, such as chromium (Cr), tungsten (W), gold (Au), etc., and this, in turn, is covered with a layer of positive electron resist. Polymethylmethacrylate (PMMA) is a high resolution, commercially available, positive resist which can be advantageously utilized in the process of the present invention. If optical lithography is eventually used in making the integrated circuit chip, then the mask substrate will consist of a glass plate; whereas, a membrane substrate is utilized for X-ray lithography. For purposes of explanation, it shall be assumed hereinafter that a layer of Cr approximately 1KÅ is thickness is deposited on a glass plate of about 2 millimeters thickness. The positive electron resist (PMMA) will have a thickness of about 5KÅ. It should be understood, however, that the present invention is in no way limited to these recited materials or specified thicknesses.

Figure 1:
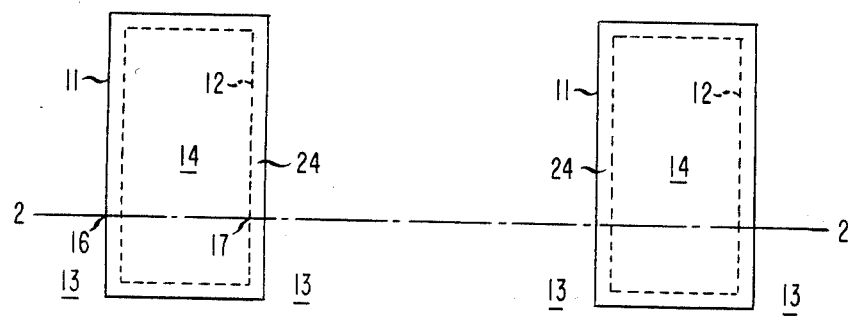
FIG. 1 shows an enlarged arbitrary mask pattern which may be utilized in the fabrication of a given level of an IC chip.

Turning now to FIG. 1 of the drawings, the lines 11 designate the outer peripheries of several parts or sections of an arbitrary mask pattern which may be utilized in the fabrication of a level of an integrated circuit wafer. As will be understood by those in the art, a plurality of mask patterns (e.g., five to seventeen or more) may be utilized in the fabrication of complex IC chips of submicron feature size. And, each of these mask patterns can be made in accordance with the process of the present invention.

A peripheral delineation of the desired mask geometry is carried out by means of a direct-write spot electron beam. That is, a spot e-beam is traced around the peripheral lines 11. This exposes the positive resist in the peripheral boundaries demarcated by the lines 11 and dotted lines 12. These exposed boundaries are on the order of 0.25 micron in width.

A development solution serves to remove the exposed positive electron resist in the peripheral boundaries between lines 11 and (dotted) lines 12. An etching operation then removes the underlying Cr in the peripheral boundaries. The PMMA resist covering the background areas 13 (see FIG. 1) and the areas 14 inside the circumscribed peripheral boundaries are unaffected by the aforementioned development since the same has not been exposed by the e-beam. The development and etching operations are carried out in accordance with well known techniques.

Figure 2:
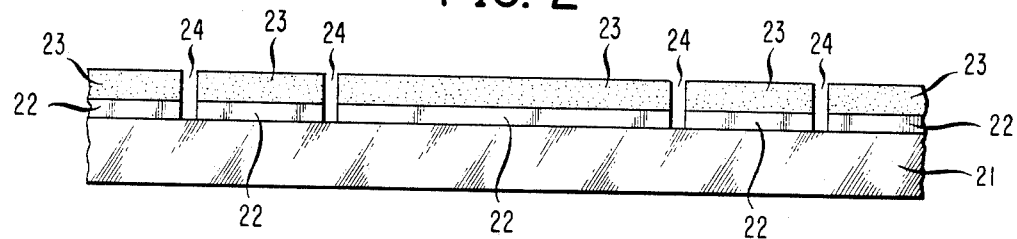
FIG. 2 is an enlarged side or elevation view of the mask pattern on the line 2—2 of FIG. 1 after the peripherally delineated electron resist and underlying metal have been moved.

As indicated in FIG. 2, except for the delineated peripheral boundaries, the glass plate 21 is covered with a layer of chromium 22 and an overlying layer of positive resist (PMMA) 23. The previously described development and etching operations result in the peripheral boundary moats 24. These moats delineate the outline or peripheries of the described mask geometry(s).

In accordance with the next step of the present invention, the mask plate is raster scanned with a low intensity e-beam (or laser beam if the positive resist is light sensitive or ion beam) until a peripheral boundary is detected by means of a backscatter detector, for example. The beam intensity is then increased significantly to a level sufficient to expose the positive resist. The line scan and exposure continue until the "mating" peripheral boundary is detected and then the beam is quickly decreased in intensity to its former low detection level. The low detection level of the e-beam can be on the order of 0.5 nanoamperes, with a high exposure level intensity of 3-5 namps.

For purposes of explanation, assume a left-to-right sweep of an e-beam along the line 2—2 of FIG. 1. The beam intensity is initially low until the leading edge of the first moat 24 is encountered at point 16 in FIG. 1. The beam intensity is then increased 6-10 times. This high, exposure level, beam intensity continues until the leading edge (point 17 in FIG. 1) of the mating boundary or moat 24 is detected and then the beam intensity is rapidly decreased to its former low detection level. And, as successive boundaries are detected the beam intensity is successively increased and decreased.

The backscatter signal is initially of a relatively high value until the leading edge of the first moat is encountered and then it drops or goes low. This will cause a substantial increase in e-beam intensity. The trailing edge of this first moat is ignored and so the impringing e-beam stays high until the leading edge of the second or mating moat is encountered, at which time the beam intensity is quickly decreased to the low detection level. This leading edge discrimination is readily accomplished by a differentiation-clipper circuit in the feedback path from the detector to the e-beam direct-write machine. The end result is that the positive electron resist (PMMA) inside the circumscribed peripheral boundaries (areas 14 of FIG. 1) is subjected to a high, exposure level, beam intensity and therefore can be readily removed.

Due to delay, either inherent or introduced, in the feedback path the increase or jump in e-beam intensity does not take place until the sweep of the e-beam traverses a part of the first moat 24. Similarly, the subsequent decrease in e-beam intensity does not occur until the beam traverses a part of the mating moat. This delayed e-beam action is desirable since the outlines or peripheries of the mask pattern(s) are accurately defined by spot e-beam lithography and thus a highly precise outline definition is achieved.

As an alternative, the raster scan could be carried out using a continuous high intensity e-beam that is swept rapidly in the low detection mode and then slowed considerably for the exposure mode.

Next, the exposed positive resist inside the circumscribed peripheral boundaries (areas 14 in FIG. 1) is removed by a known development technique. An etching operation is then used to remove the underlying Cr in the rectangular areas 14.

Figure 3:
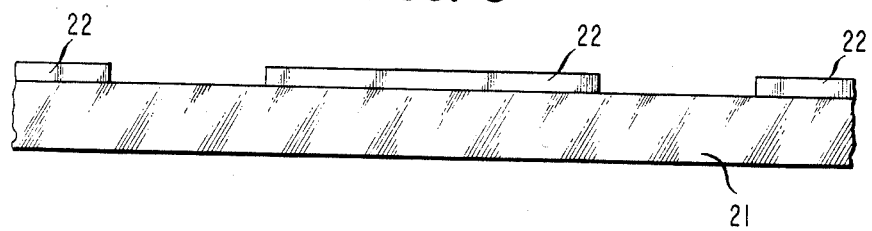
FIG. 3 is a side view of the completed mask pattern.

Finally, a conventional oxygen plasma dry etch is utilized to remove the PMMA from the background areas 13, i.e., from those areas lying outside the two patterns or parts circumscribed by the moats 24. The background areas 13 remain covered by the chromium layer 22. FIG. 3 shows a side view of the finished mask pattern. With the exception of the two rectangular patterns which are precisely outlined by e-beam lithography, the glass plate is covered by the layer of chromium 22. This mask consisting of two rectangles defined by the lines 11 will then be used in a conventional lithography procedure to make a level of an. IC chip.

Instead of raster scanning an e-beam over the mask plate, a laser focused beam can be utilized in combination with a PMT (photomultiplier tube) detector. If a laser beam is used for this raster scanning operation, the positive electron resist should be light sensitive. Further, instead of backscattering detection, a detector might be placed on the other side of a membrane substrate. The latter detection will measure the beam penetration through the mask membrane, for example, and when a moat is first encountered the penetrating beam will increase or jump in intensity and a feedback to the beam producing mechanism will serve to increase the impinging beam intensity.

Having thus shown and described what is at present considered to be the preferred technique for making very precise IC chip process masks, it should be understood that the same has been shown by way of illustration and not limitation. Accordingly, all modifications, alterations and changes coming within the spirit and scope of the invention as defined in the appended claims are herein meant to be included.

What is claimed is:

1. A method of lithographic patterning of integrated circuit chip process mask plates and mask membranes comprising the steps of:

applying a thin layer of metal over a mask substrate;

covering the layer of metal with a layer of positive electron resist;

delineating the peripheral boundaries of the desired mask geometry using a direct-write spot electron beam;

said electron beam serving to expose the resist in the peripheral boundaries delineated by said electron beam;

developing and etching the mask substrate to remove the positive resist and the underlying metal in the exposed peripheral boundaries;

raster scanning the mask substrate with a low exposure-level intensity beam until a peripheral boundary is detected, the detection then serving to increase the beam intensity six or more times so as to expose the high intensity raster scanned positive resist;

said scanning and high intensity exposure continuing until the mating peripheral boundary is detected, the latter detection then serving to rapidly decrease the beam intensity to its former low exposure-level intensity;

developing the substrate to remove the positive resist subjected to the increased exposure-level beam intensity;

etching away the metal underlying the positive resist that was subject to said exposure-level beam intensity; and removing the remaining positive electron resist covering the substrate area outside of the geometry(s) circumscribed or delineated by said peripheral boundaries, said detection having an intrinsic delay so that the increase and decrease in beam intensity occurs a short predetermined time after a boundary has been encountered.

2. A method as defined in claim 1 wherein the raster scanned exposure-level beam intensity is 6-10 times greater than said low intensity level.

3. A method as defined in claim 2 wherein said positive resist comprises polymethylmethacrylate.

4. A method as defined in claim 3 wherein the peripheral boundaries delineated by the spot electron beam are on the order of 0.25 micron in width.

5. A method as defined in claim 4 wherein said mask substrate comprises a glass plate.

6. A method as defined in claim 4 wherein said mask substrate comprises a membrane suitable for X-ray lithography purposes.

7. A method as defined in claim 4 wherein the scanning beam is an electron beam.

8. A method as defined in claim 4 wherein the scanning beam is a laser beam.

9. A method as defined in claim 4 wherein the scanning beam is an ion beam.

10. A method as defined in claim 4 wherein said metal is chromium.

* * * * *